(12) United States Patent
Gibson et al.

(10) Patent No.: US 6,362,990 B1
(45) Date of Patent: Mar. 26, 2002

(54) THREE PORT CONTENT ADDRESSABLE MEMORY DEVICE AND METHODS FOR IMPLEMENTING THE SAME

(75) Inventors: G. F. Randall Gibson, Nepean; Farhad Shafai; Kenneth J. Schultz, both of Kanata, all of (CA)

(73) Assignee: SiberCore Technologies (CA)

( * ) Notice: Subject to any disclaimer, the term of this patent is extended or adjusted under 35 U.S.C. 154(b) by 0 days.

(21) Appl. No.: 09/654,319

(22) Filed: Sep. 1, 2000

Related U.S. Application Data
(60) Provisional application No. 60/153,388, filed on Sep. 10, 1999, and provisional application No. 60/167,155, filed on Nov. 23, 1999.

(51) Int. Cl.[7] .............................................. G11C 15/00
(52) U.S. Cl. ..................... 365/49; 365/230.05; 711/108
(58) Field of Search .............................. 365/230.05, 49, 365/230.01; 711/108

(56) References Cited

U.S. PATENT DOCUMENTS

| | | | |
|---|---|---|---|
| 4,376,974 A | 3/1983 | Stewart et al. .............. 364/200 |
| 4,532,606 A | 7/1985 | Phelps .......................... 365/49 |
| 4,559,618 A | 12/1985 | Houseman et al. ........... 365/49 |
| 4,622,653 A | 11/1986 | McElroy ...................... 365/49 |
| 4,646,271 A | 2/1987 | Uchiyama et al. ............ 365/49 |
| 4,670,858 A | 6/1987 | Almy ........................... 365/49 |
| 4,723,224 A | 2/1988 | Van Hulett et al. ........... 365/49 |
| 4,758,982 A | 7/1988 | Price .......................... 364/900 |
| 4,794,559 A | 12/1988 | Greenberger ................. 365/49 |
| 4,996,666 A | 2/1991 | Duluk, Jr. .................... 365/49 |
| 5,051,949 A | 9/1991 | Young .......................... 365/49 |
| 5,185,888 A | 2/1993 | Tanaka et al. ............... 395/600 |
| 5,257,220 A | 10/1993 | Shin et al. .................... 365/49 |
| 5,319,590 A | 6/1994 | Montoye ...................... 365/49 |
| 5,351,208 A | 9/1994 | Jiang ........................... 365/49 |
| 5,568,415 A | 10/1996 | McLellan et al. ............. 365/49 |
| 5,608,662 A | 3/1997 | Large et al. ........... 364/724.01 |
| 5,699,288 A | 12/1997 | Kim et al. .................... 365/49 |
| 5,752,260 A | 5/1998 | Liu ............................. 711/129 |
| 5,784,709 A | 7/1998 | McLellan et al. ........... 711/207 |
| 5,818,786 A | 10/1998 | Yoneda .................. 365/230.03 |
| 5,828,593 A | 10/1998 | Schultz et al. ................ 365/49 |
| 5,859,791 A | 1/1999 | Schultz et al. ................ 365/49 |
| 6,199,140 B1 * | 3/2001 | Srinivasan et al. .......... 711/108 |

FOREIGN PATENT DOCUMENTS

| | | | |
|---|---|---|---|
| EP | 491 498 A2 | 6/1992 | ........... G06F/12/10 |
| EP | 0 899 668 A2 | 3/1999 | ........... G06F/17/30 |

OTHER PUBLICATIONS

Ghose, "The architecture of response–pipelined content addressable memories", Jul. 1994, Microprocessing & Microprogramming, No. 6, Dept. of Computer Science, NY.

Yamagata, Mihara, Hamamoto, Murai, Kobayashi, "A 288–kb Fully Parallel Content Addressable Memory Using a Stacked–Capacitor Cell Structure", Dec. 27, 1992, IEEE Journal of Solid State Circuits, vol. 27, No. 12, NY.

Uvieghara, Nakagome, Jeong, Hodges, "An On–Chip Smart Memory for a Data–Flow CPU", Feb. 25, 1990, IEEE Journal of Solid–State Circuits, No. 1, NY.

* cited by examiner

*Primary Examiner*—Hoai V. Ho
(74) *Attorney, Agent, or Firm*—Martine & Penilla, LLP

(57) ABSTRACT

A three-port content addressable memory (CAM) device and method thereof are provided. The three-port CAM device includes a CAM, a search control block, and a maintenance control block. The CAM is configured to store data. The search control block is arranged to receive search data and search control signals via a first port for searching the search data in the CAM. The search control block is further configured to perform search operations by accessing the CAM. The search operations are performed within search cycles with each search operation being performed over multiple clock cycles. In this configuration, more than one search operations are capable of being performed simultaneously over one or more clock cycles. Search results of the search operations are output via a second port. The maintenance control block is configured to perform read/write operations by reading or writing specified data in the CAM via a third port.

28 Claims, 8 Drawing Sheets

THREE PORT CONTENT ADDRESSABLE MEMORY DEVICE AND METHODS FOR IMPLEMENTING THE SAME

CROSS REFERENCE TO RELATED APPLICATIONS

This application claims priority from U.S. Provisional Patent Application No. 60/153,388 filed on Sep. 10, 1999, and entitled "Content Addressable Memory Circuitry" and from U.S. Provisional Patent Application No. 60/167,155 filed on Nov. 23, 1999, and entitled "Three Port Content Addressable Memory Circuit and Methods for Implementing the Same." This application is also related to U.S. Provisional Application No. 60/166,964 filed on Nov. 23, 1999 and entitled "Content Addressable Memory Circuit with Redundant Array and Method for Implementing the Same." These provisional applications are incorporated herein by reference.

BACKGROUND OF THE INVENTION

1. Field of the Invention

The present invention relates generally to memory devices, and more particularly to a content addressable memory device for providing uninterrupted search operations synchronized with read/write operations and independent search and maintenance interfaces.

2. Description of the Related Art

Memory devices are indispensable components of modern computer systems. As storage devices, they are used to provide fast access to data and instructions stored therein. Content addressable memory (CAM) is a special type of memory that is often used for performing address searches. For example, Internet routers often include a CAM for searching the address of specified data. The use of CAMs allows the routers to perform address searches to allow computer systems to communicate data with one another over networks. Besides routers, CAMs are also utilized in other areas such as database searches, image processing, and voice recognition applications.

CAMs generally include a two-dimensional row and column content address memory array of core cells, such that each row contains an address, pointer, or bit pattern entry. Based on such array of cells, a CAM may perform "read" and "write" operations at specific addresses like a conventional random access memory (RAM). In addition, it also performs "search" operations that simultaneously compare a bit pattern of data known as "comparand" against an entire list (i.e., column) of pre-stored entries (i.e., rows) of bit patterns in the CAM array.

Conventional CAMs are typically two port devices. FIG. 1A shows a block diagram of a conventional two-port CAM 100. The CAM 100 includes an input port 107 and an output port 109. The input port 107 communicates data and control signals over a data bus 102 for communicating data and an instruction bus 104 for transmitting instructions associated with an operation to be performed. The data bus 102 is used to receive a comparand or write data as inputs and is thus shared for performing either a search operation or a write operation.

The output port 109 is shared for a search operation or a read operation. Specifically, the output port 109 outputs either search results or read results from the CAM 100 via an output bus 106. In a search operation, for example, the CAM 100 may output a search result, via output bus 106, in the form of an address, pointer, or bit pattern corresponding to an entry that matches the input data. Alternatively, the read results may be output through the data bus 102.

The conventional CAM 100 typically performs operations such as search, read, and/or write operations in sequence. FIG. 1B shows an exemplary sequence of operations that are serially performed in successive memory clock cycles by the CAM 100. As shown in FIG. 1B, the CAM performs a series of operations beginning with three "search" operations, a "write" operation, two "search" operations, a "write" operation, two "read" operations, and ending with two "search" operations. These operations are performed one after another, in sequence, with each operation being performed in at least one clock cycle.

Unfortunately, however, the sequential nature of the CAM operations degrade the performance of a CAM by delaying search operations. This is because the "read" and "write" operations interrupt "search" operations. As can be appreciated, the interruption in such search operations presents a significant impediment to high speed "real time" successive address searching and thereby complicates system design. For example, Internet routers are often called upon to perform many searches of routing tables stored in their CAMs. In such situations, interruptions in searches delay the processing of search operations and thus slow down the response times of computer systems in general.

Additionally, the sharing of the input port 107 by comparand and write data typically requires multiplexing of comparand and write data for input to the CAM 100 Similarly, the sharing of the output port 109 for outputting search results and read results also entails de-multiplexing these results. FIG. 1C shows a more detailed block diagram of the conventional two-port CAM 100 with a multiplexer 111 and a de-multiplexer 113. The CAM 100 includes a control block 108 and a CAM array 110. The multiplexer 111 receives a comparand and/or write data as inputs and selects either the comparand or the write data for output in response to a control signal. The selected output from the multiplexer 111 is then provided to the data bus 102 for input to the CAM array 110.

To control the operation of the CAM 100, control signals are provided to the instruction bus 104 for input to the control block 108. In response to the control signals, the control block 108 generates another set of control signals for controlling the operations of the CAM array 110. In a search operation, the CAM array 110 outputs, on the result bus 106 an address, pointer, or bit pattern (collectively referred herein as "address") corresponding to an entry or word in the CAM array 110 that matches the input data on the data bus 102. For a read operation, on the other hand, the CAM outputs on the result bus 106 data corresponding to the address provided on data bus 102.

The demultiplexer 113 is coupled to receive an output result from the output bus 106 as an input. When the CAM operation is a search operation, the demultiplexer 113 routes the output result onto a search data bus 115. On the other hand, when the CAM operation is a read operation, the demultiplexer 113 routes the output result onto a read data bus 117.

FIG. 1D shows another block diagram of the conventional CAM 100 in more detail. The CAM 100 includes data bus 102, instruction bus 104, result bus 106, control block 108, CAM array 110, multiplexer (MUX) 112, comparand register 114, global mask registers 116, status register 118, and address counter 120. The control block 108 receives instructions for a desired operation through instruction bus 104, and generates the control signals for the "search," "read," and "write" operations of the CAM array 110. The CAM 100 illustrated in FIG. 1D is commercially available, for example, as model NL85721 Ternary Content Addressable Memory IPCAM from Netlogic Micosystems, Inc.

Unfortunately, using a multiplexing scheme in performing read/write and search operations adds complexity in implementing conventional two-port CAMs with attendant increase in cost. Furthermore, the multiplexing scheme slows down overall CAM performance since read/write data cannot be input or output simultaneously in a same clock cycle with a search data or result. Indeed, a read or write operation must "steal" cycles from the search operations because the buses 102 and 106 are shared.

In view of the foregoing, there is a need for a CAM device and method that can perform read/write operations and search operations simultaneously without multiplexing input data and output results so as to improve CAM performance.

SUMMARY OF THE INVENTION

The present invention fills this need by providing three-port content addressable memory (CAM) devices and methods for implementing the same. It should be appreciated that the present invention can be implemented in numerous ways, including as a process, an apparatus, a system, a device, or a method. Several embodiments of the present invention are described below.

In one embodiment, the present invention provides a three-port CAM device including a CAM, a search control block, and a maintenance control block. The CAM is configured to store data. The search control block is arranged to receive search data and search control signals via a first port for searching the search data in the CAM. The search control block is further configured to perform search operations by accessing the CAM. The search operations are performed within search cycles with each search operation being performed over multiple clock cycles. In this configuration, more than one search operations are capable of being performed simultaneously over one or more clock cycles. Search results of the search operations are output via a second port. The maintenance control block is configured to perform read/write operations by reading or writing specified data in the CAM via a third port.

In another embodiment, the present invention provides a method for performing search operations and read/write operations in a CAM device. In this method, a CAM is provided for storing data. Search data and search control signals are then provided to a search control block via a first port for searching the search data in the CAM. The search control block is configured to perform search operations by accessing the content addressable memory. The search operations are performed within search cycles over multiple clock cycles. More than one search operations are capable of being performed simultaneously over one or more clock cycles. Search results from the CAM are output via a second port. Read/write operations are performed by reading or writing specified data in the CAM via a third port.

In yet another embodiment, a three-port CAM device for accessing a CAM containing data is disclosed. The three-port CAM device includes a content addressable memory for storing data, a first port, a second port, and a third port. The first port is configured to receive search data and search control signals for searching the search data in the content addressable memory. Search operations are performed by accessing the content addressable memory. The second port is configured to output search results from the content addressable memory. The third port is configured to communicate read/write data to and from the content addressable memory for read/write operations.

Advantageously, the three-port arrangement of the present invention effectively separates search datapath and read/write datapath. This allows read/write operations to be performed during search clock cycles without corrupting or otherwise compromising the search results. Furthermore, allowing a read/write operation to be performed in a search cycle speeds up search operations by eliminating search interruptions caused by read/write operations. Accordingly, the devices and method of the present invention provide a faster speed of operation at a given clock frequency. Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for a three-port content addressable memory (CAM) device that allows uninterrupted search operations while performing read and/or write operations is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
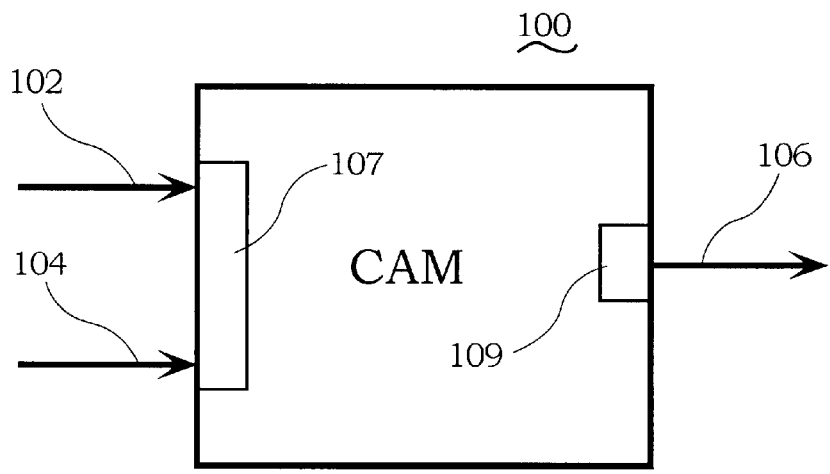
FIG. 1A shows a block diagram of a conventional two-port content addressable memory (CAM).
Figure 1B:
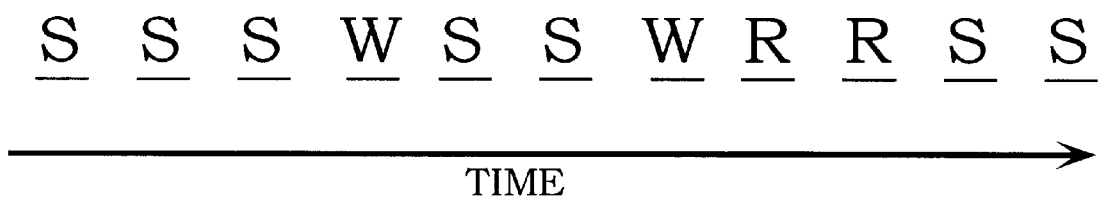
FIG. 1B shows a sequence of operations that can be sequentially performed in successive memory clock cycles by the CAM shown in FIG. 1A.
Figure 1C:
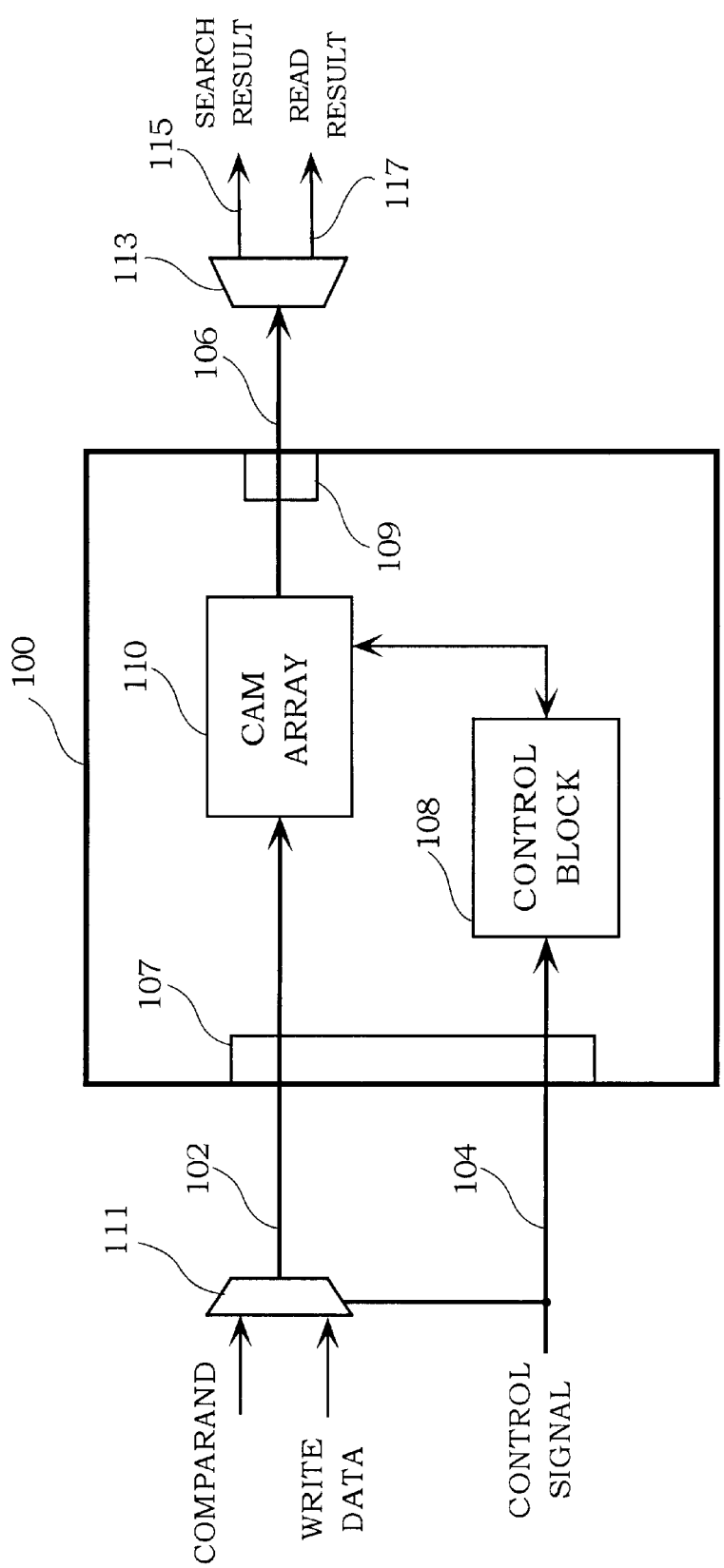
FIG. 1C shows a more detailed block diagram of the conventional two-port CAM with a multiplexer 111 and a demultiplexer 113.
Figure 1D:
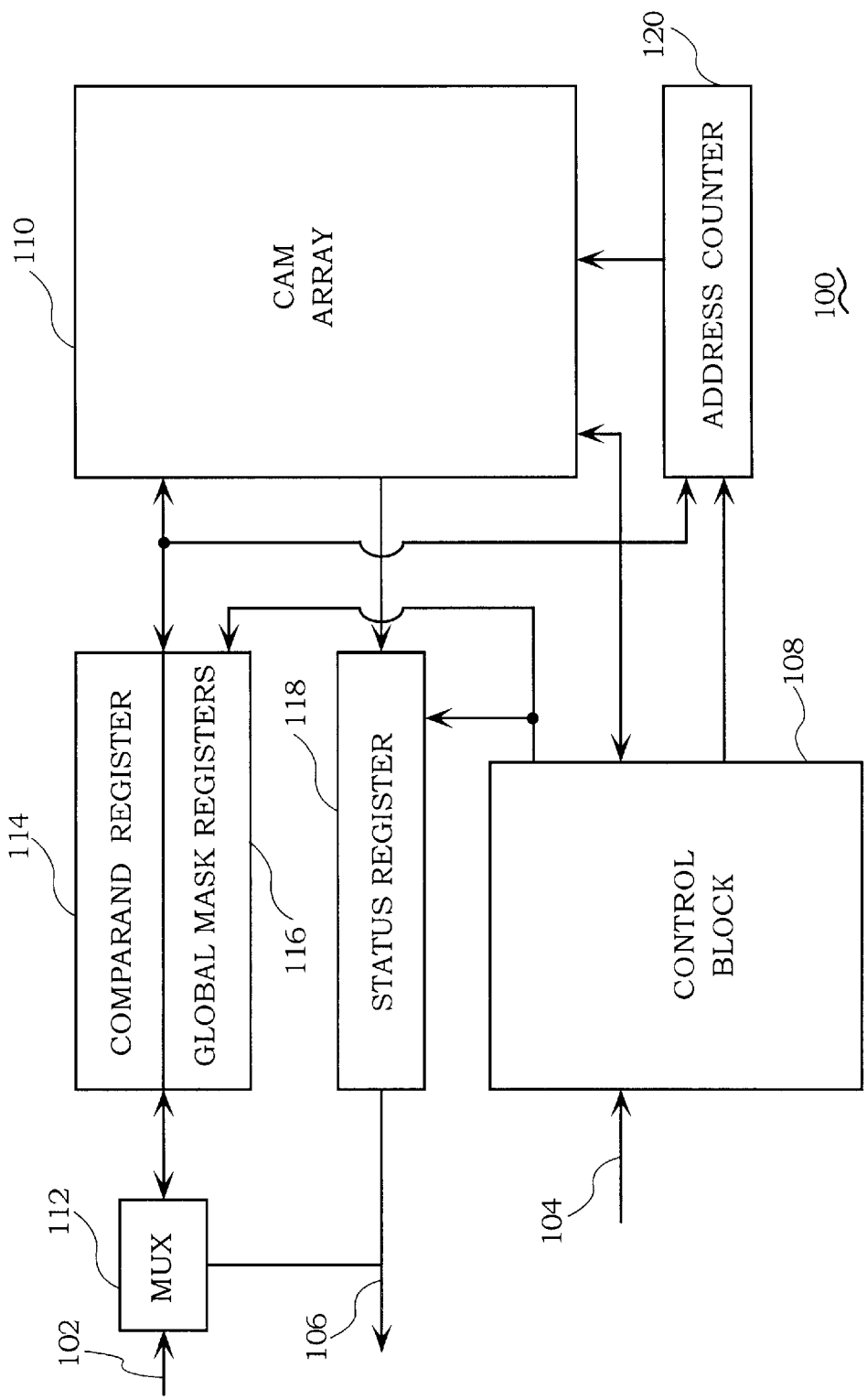
FIG. 1D shows another block diagram of a conventional CAM in more detail.
Figure 2A:
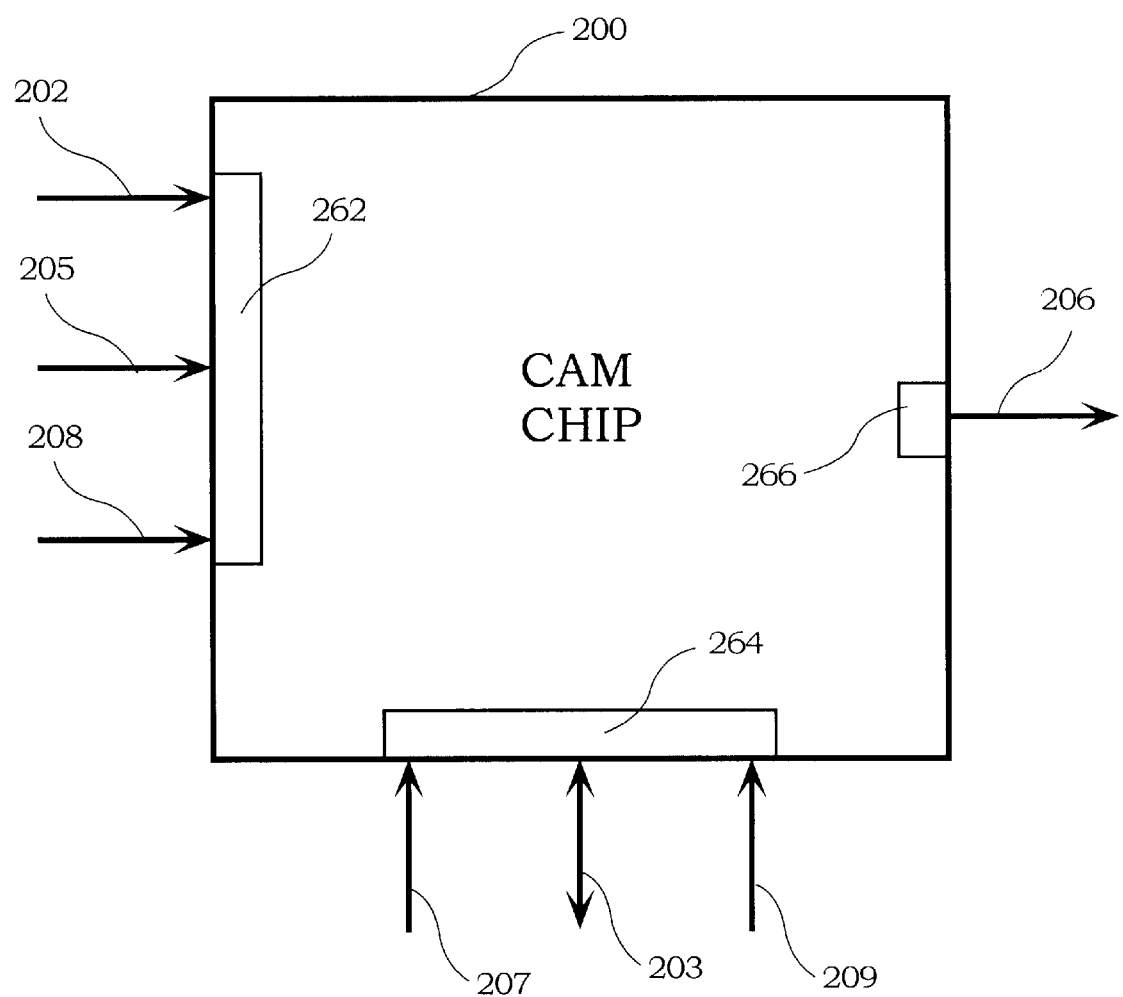
FIG. 2A shows an exemplary three-port CAM device 200 that separates search datapath and read/write datapath in accordance with one embodiment of the present invention.

FIG. 2A shows an exemplary three-port CAM device 200 that separates search datapath and read/write datapath in accordance with one embodiment of the present invention.

The three-port CAM device 200 includes three ports: a search input port 262, a search result port 266, and a maintenance port 264. The search input port 262 communicates input search data, search control signals, and search clock signals over search bus 202, search control bus 205, and search clock bus 208, respectively. The search result port 266 communicates search results over a search result bus 206. Separated from the search input and search result ports 262 and 266, the maintenance port 264 is arranged to communicate read/write data, read/write control signals, and read/write clock signals over read/write data bus 203, read/write control bus 207, and read/write clock bus 209, respectively.

The three-port CAM device 200 is configured to perform search operation and read/write operations. Specifically, for a search operation, the CAM device 200 is provided, via search input port 262, with search data over the search bus 202, search control signals over the search control bus 205, and a search clock over a search clock bus 208. The search result is then provided through the search result port 266 via the search result bus 206 as an output. On the other hand, for a read and/or write operation, the CAM 200 receives read/write control signals, via maintenance port 264, over a read/write control bus 207, read/write data over a read/write data bus 203, and a read/write clock over a read/write clock bus 209. It should be noted that the clock signals provided over the search clock bus 208 and read/write clock bus 209 may be the same clock signal.

Figure 2B:
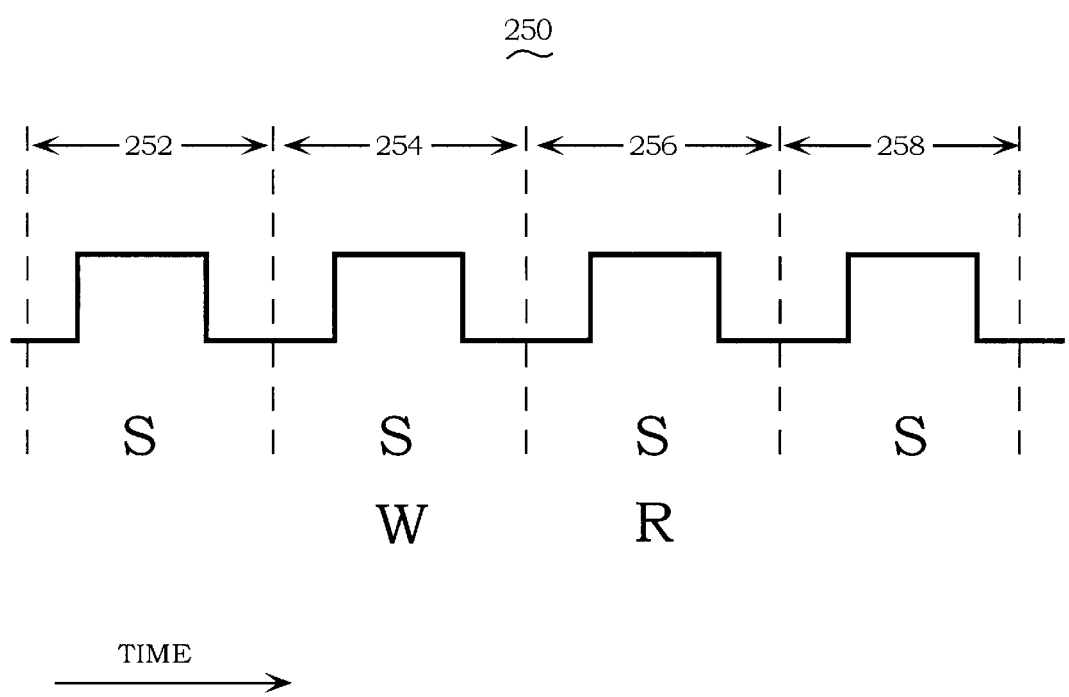
FIG. 2B illustrates a timing diagram showing a sequence of operations performed by the three-port CAM device in accordance with one embodiment of the present invention.

The three-port CAM device 200 with separate search and read/write datapaths allows read/write operations to be performed in the same clock cycle as a search operation. For example, FIG. 2B illustrates a timing diagram 250 showing a sequence of operations performed by the CAM device 200 in accordance with one embodiment of the present invention. In this timing diagram, search operations are performed in sequence for clock cycles 252, 254, 256, and 258 with one search operation being performed for each clock cycle. Initially, only a search operation takes place in cycle 252. Then in the next cycle 254, both a search operation and a write operation are performed. During this cycle, the CAM device 200 performs the search operation via search port 262 and performs the write operation within the same clock cycle 254 via maintenance port 264.

During the next cycle 256, a search operation and a read operation are performed. In this cycle 256, the CAM device 200 performs the search operation and performs the read operation within the same clock cycle 256. Then, in the next clock cycle 258, the CAM device 200 performs another search operation. In this manner, read/write operations are performed in the same cycle as search operations without compromising or corrupting search results. It should be noted that the search operations may persist over multiple clock cycles. In addition, multiple searches may be underway simultaneously over the clock cycles.

In addition, by allowing a read/write operation to be performed within the same clock cycle as a search operation, the read/write operations no longer interrupt or interfere with search operations. Accordingly, the three-port CAM device 200 of the present invention may perform search operations without the delays caused by sharing read/write and search datapaths in conventional two-port CAM devices. This also simplifies the system level design by separating the search datapath from the maintenance (e.g., read/write) datapath.

Figure 2C:
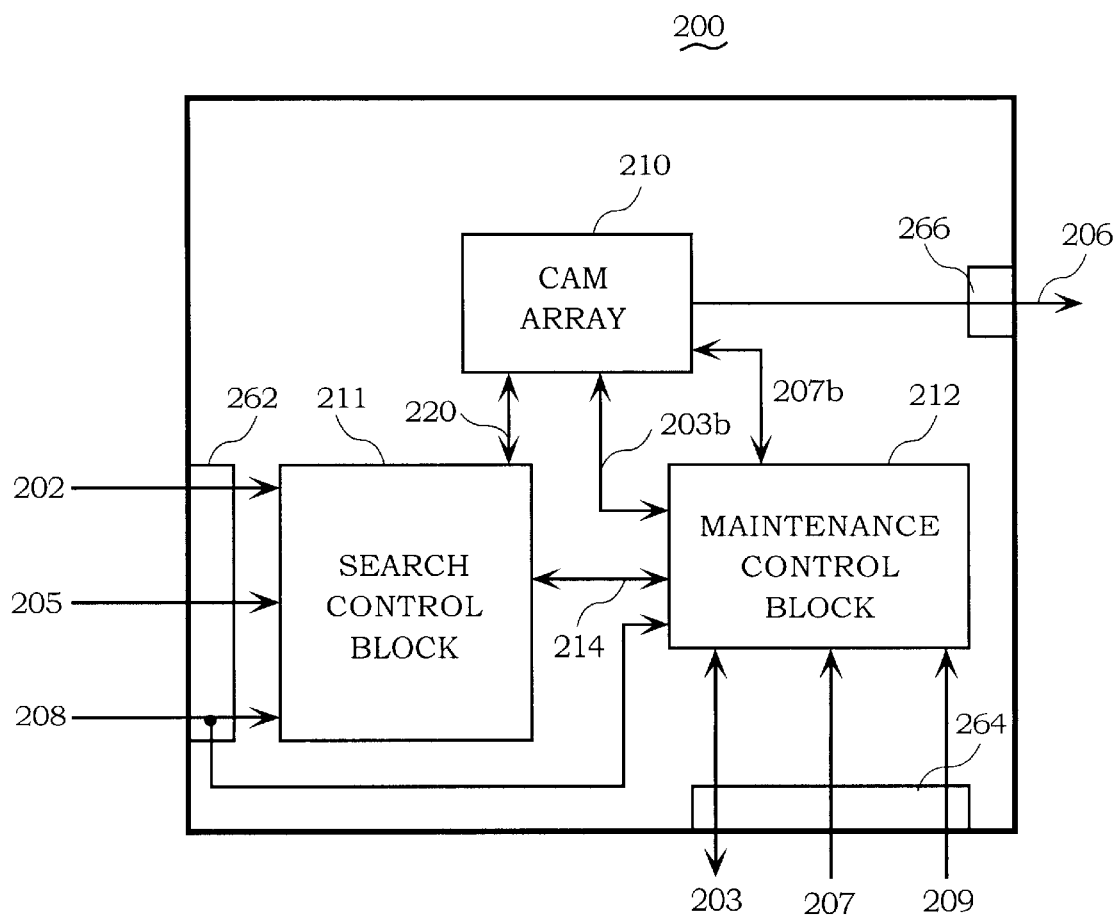
FIG. 2C shows a more detailed block diagram of the three-port CAM device in accordance with one embodiment of the invention.

FIG. 2C shows a more detailed block diagram of the three-port CAM device 200 in accordance with one embodiment of the invention. The three-port CAM device 200 includes a CAM array 210, a search control block 211, and a maintenance control block 212. The search control block 211 receives, via search input port 262, search data over the search data bus 202, search control signal over the search control bus 205, and search clock over the search clock bus 208. The maintenance control block 212 receives, via maintenance port 264, read/write control signals over the read/write control signal bus 207, read/write data via read/write data bus 203, and read/write clock signal over the read/write clock bus 209. The CAM array 210 is coupled to the search and maintenance control blocks 211 and 212 to communicate data and control signals over buses 220, 203b, and 207b. It should be noted that the term "block" as used herein refers to a device, apparatus, subsystem, and the like, and may be used interchangeably with such terms.

In this three-port configuration, the search control block 211 generates and communicates control signals along with specified search data over the bus 220 to search for the search data in the CAM array 210. Upon completion of the search, the CAM array 210 outputs the address of the specified data over the search result bus 206 via search result port 266. The maintenance control block 212, on the other hand, controls read/write operations. Specifically, the maintenance control block 212 generates and communicates control signals along with specified data over buses 203b and 207b to read or write the data in the CAM array 210. For example, the maintenance control block 212 receives the data (e.g., data and address for writing, address for reading) and control signals over the data bus 203 and the control bus 207. It then transmits the data and control signals over the data bus 203b and the control bus 207b for reading or writing the data in the CAM array 210. In a read operation, the CAM array 210 provides the data over bus 203b to the maintenance control block 212, which outputs the data over the data bus 203. To synchronize the search operation with read/write operations, the search and maintenance control blocks 211 and 212 communicate synchronization signals over a synchronization bus 214.

Alternative embodiments of the invention may include CAMs with multiple CAM arrays, multiple search control blocks, multiple maintenance control blocks, or separate read control blocks and write control blocks. In addition, multiple copies of data may be stored in multiple banks. For example, in a two-bank arrangement, the data may be read or written from one bank while searches take place in the other bank. Alternative embodiments of the invention may also include a CAM with one or more CAM arrays incorporating internal search or maintenance control blocks or a CAM in a non-array format. Furthermore, alternative embodiments of the invention may include a CAM with additional control signals, either static or dynamically clocked devices, multiple clock signals, or separate substrates. Maintenance operations other than read or write such as chip configuration or register operations may also be handled by the maintenance port.

Figure 3A:
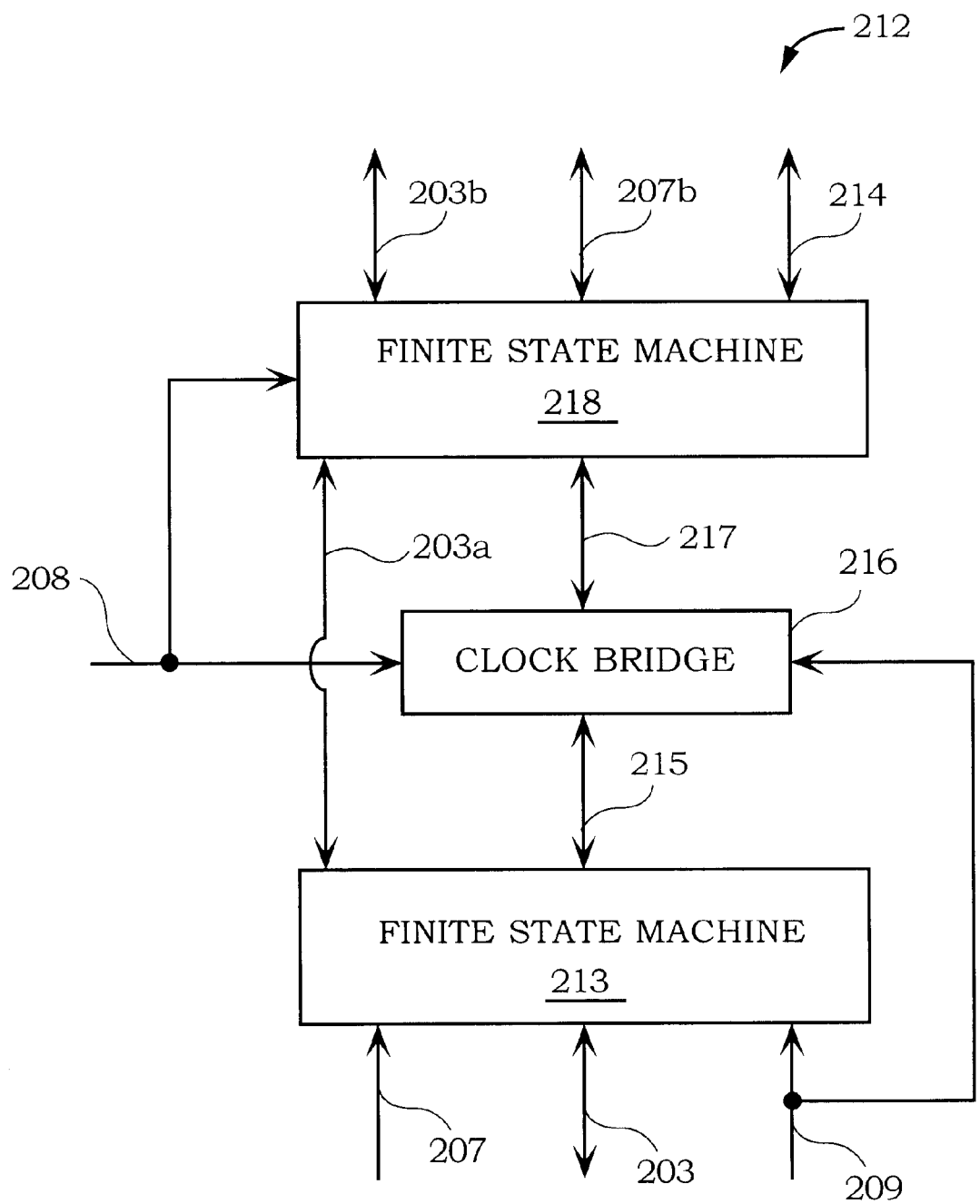
FIG. 3A shows a more detailed block diagram of a maintenance control block according to one embodiment of the invention.

FIG. 3A shows a more detailed block diagram of the maintenance control block 212 according to one embodiment of the invention. The maintenance control block 212 includes a clock bridge 216 for arbitrating clocks and a pair of finite state machines 213 and 218. The finite state machine 213 receives read/write control signals over read/write control bus 207 and read/write data over read/write data bus 203. The finite state machine 213 also receives a read/write clock over the read/write clock bus 209. Additionally, the finite state machine 213 generates control signals by parsing received control signals and captures the read/write data. It then transmits the generated control signals over control bus 215 to the clock bridge 216, which synchronizes the search and read/write clocks received on the search clock bus 208 and read/write clock bus 209. Further, the finite state machine 213 may be used to control the handshaking between a processor port (not shown) and an external chip port (not shown).

In response to control signals received over the control bus 215, the clock bridge 216 generates and communicates control signals via control signal bus 217 to the other finite state machine 218. The finite state machine 218 receives search clock from the search clock bus 208 and synchronizes the read/write operations with search operations via control bus 214. It also generates and communicates read/write control signals via read/write control bus 207b and 203b to the CAM array 210 for performing read/write operations. A bus 203a is provided between the finite state machines 213 and 218 to allow communication of data in read/write operations. For example, in a write operation, data flows from finite state machine 213 to finite state machine 218 via bus 203a. Conversely for a read operation, data flows from finite state machine 218 to finite state machine 213 via bus 203a. The finite state machines 213 and 218 may be as simple as one or two logic gates.

Figure 3B:
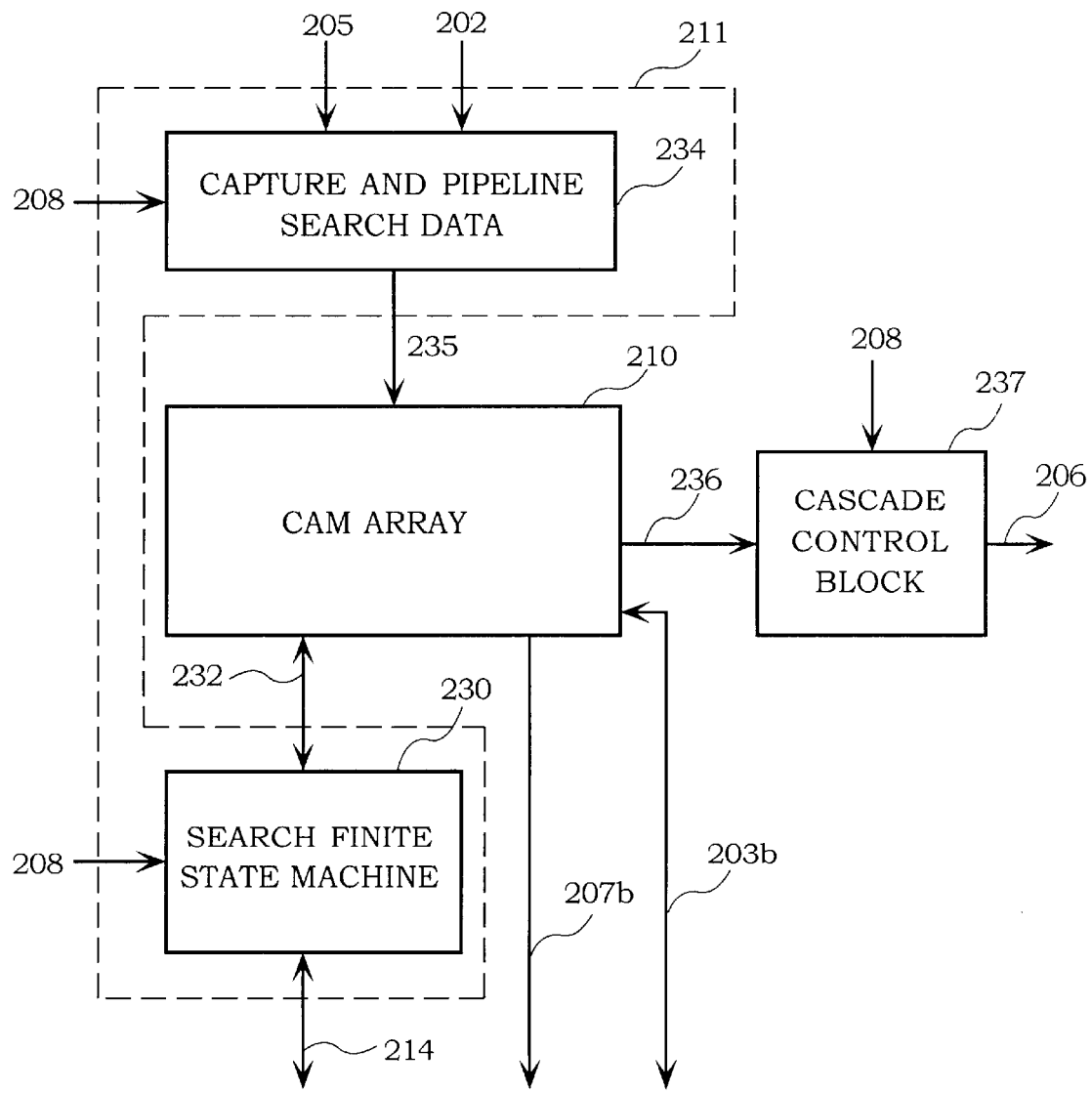
FIG. 3B shows a more detailed block diagram of a search control block communicating with a CAM array in accordance with one embodiment of the present invention.

FIG. 3B shows a more detailed block diagram of the search control block 211 communicating with the CAM array 210 in accordance with one embodiment of the present invention. The search control block 211 includes a search finite state machine 230 and a capture and pipeline search data device 234. The capture and pipeline search data device 234 receives as inputs search data over the search data bus 202, search control signal over the search control bus 205, a search clock over the search clock bus 208. Upon receiving such signals, the capture and pipeline search data device 234 generates and communicates control and data signals to the CAM array 210 over a control and data bus 235.

The search finite state machine 230 receives the search clock over the search clock bus 208, and generates and communicates control signals over control bus 232 to CAM array 210. In addition, it generates and communicates synchronization control signals over control bus 214 to the finite state machine 218 of the maintenance control block 212. In one embodiment, the search finite state machine 230 may be implemented by using the finite state machine 218. The control bus 232 and the control and data bus 235 correspond to the control and data bus 220 shown in FIG. 2C. The CAM array 210 also communicates control signals over control bus 207b and 203b with the maintenance control block 212.

A cascade control block 237 is provided to receive the search clock over search clock bus 208 and output data (e.g., search address) over data bus 236 from the CAM array 210. It then provides the output data to the search result port 266 via search result bus 206. In addition, the cascade control block 237 is configured so that a set of CAM chips 200 may be connected in parallel to allow for concatenating a plurality of content addressable memories to hold a larger number of entries of specified data. The cascade control block 237 may be an output buffer when the three-port CAM device 200 is used alone. In one embodiment, the cascade control block 237 may be included in the search control block 211. Alternatively, it may be provided as a separate output stage in the CAM device 200.

Thus, the present invention enhances search operations of the CAM array while allowing read and write operations to be performed during the search cycles. Whereas the conventional CAMs have typically performed search and read/write operations sequentially in separate clock cycles, allowing a read/write operation to be performed in a search cycle speeds up search operations by eliminating interruptions. Accordingly, the CAM devices of the present invention provide a higher throughput at a given clock frequency.

It should be understood that the various block diagrams may be embodied in any form which may include, for example, any suitable semiconductor substrate, printed device board, packaged integrated device, or software implementation. Accordingly, those skilled in the art will recognize that the present embodiments are to be considered as illustrative and not restrictive, and the invention is not to be limited to the details given herein, but may be modified within the scope and equivalents of the appended claims.

What is claimed is:

1. A three-port content addressable memory device, comprising:

a content addressable memory for storing data;

a search control block arranged to receive search data and search control signals via a first port for searching the search data in the content addressable memory, the search control block being configured to perform search operations by accessing the content addressable memory, the search operations being performed within search cycles, each search cycle comprising multiple clock cycles, wherein more than one search operations are capable of being performed simultaneously over one or more clock cycles, and wherein the content addressable memory outputs search results via a second port; and a maintenance control block configured to perform read/write operations by reading or writing specified data in the content addressable memory via a third port, the maintenance control block being configured to perform a read or write operation by accessing the content addressable memory.

2. The three-port content addressable memory device as recited in claim 1, wherein the maintenance control block performs the read or write operation simultaneously with a search operation by accessing the content addressable memory within a specified search cycle of the search operation.

3. The three-port content addressable memory device as recited in claim 1, wherein the content addressable memory includes a set of banks for storing the data and wherein the data is accessed from one of the banks in the read/write operation while the data in another bank is searched in a search operation.

4. The three-port content addressable memory device as recited in claim 1, wherein the first port, second port, and third port are search input port, search result port, and read/write port.

5. The three-port content addressable memory device as recited in claim 1, wherein the search control block receives the search data via the first port over a search data bus, wherein the maintenance control block communicates the specified data via the third port over a read/write data bus, and wherein the content addressable memory outputs the search results via the second port over a search result bus.

6. The three-port content addressable memory device recited in claim 1, wherein the maintenance control block accesses the content addressable memory in a sequence synchronized to the search of the content addressable memory.

7. The three-port content addressable memory device recited in claim 1, wherein the search control block generates a first set of control signals for searching the content addressable memory and the maintenance control block generates a second set of control signals for reading or writing the specified data in the content addressable memory.

8. The three-port content addressable memory device recited in claim 1, wherein the search control block includes:
    a capture and pipeline search data device configured to capture and provide the search data to the content addressable memory; and
    a first finite state machine configured to generate signals to control the search operations of the content addressable memory.

9. The three-port content addressable memory device recited in claim 8, further comprising a cascade control block for concatenating a plurality of content addressable memory devices to store a plurality of entries of data.

10. The three-port content addressable memory device recited in claim 1, wherein the maintenance control block includes a clock bridge for synchronizing the read/write operations with search operations.

11. The three-port content addressable memory device recited in claim 10, wherein a first clock for the maintenance control block and a second clock for the search control block are inputs to the clock bridge.

12. The three-port content addressable memory device recited in claim 10, wherein the maintenance control block further includes a second finite state machine to generate control signals to perform the read/write operations.

13. A method for performing search operations and read/write operations in a content addressable memory device, comprising:
    providing a content addressable memory for storing data;
    providing search data and search control signals to a search control block via a first port for searching the search data in the content addressable memory, the search control block being configured to perform search operations by accessing the content addressable memory, the search operations being performed within search cycles that comprise multiple clock cycles, wherein more than one search operations are capable of being performed simultaneously over one or more clock cycles, and wherein the content addressable memory outputs search results via a second port; and
    performing read/write operations by reading or writing specified data in the content addressable memory via a third port.

14. The method as recited in claim 13, wherein the content addressable memory includes a set of banks for storing the data and wherein the data is accessed from one of the banks in the read/write operation while the data in another bank is searched in a search operation.

15. The method as recited in claim 13, wherein each read/write operation is performed within a specified search cycle of a search operation.

16. The method as recited in claim 13, wherein the first port, second port, and third port are search input port, search result port, and read/write port.

17. The method as recited in claim 13, wherein the search control block receives the search data via the first port over a search data bus, wherein the maintenance control block communicates the specified data via the third port over a read/write data bus, and wherein the content addressable memory outputs the search results via the second port over a search result bus.

18. The method as recited in claim 13, wherein the operation of performing the read/write operations further comprises:
    providing a pair of first finite state machines for generating signals to control the read/write operations of the content addressable memory; and
    providing a clock bridge provided between the pair of first finite state machines for synchronizing the read/write operations with the search operations of the content addressable memory.

19. The method as recited in claim 13, wherein the operation of providing the search data and search control signals to the search control block further comprises:
    providing a second finite state machine for controlling the search operations of the content addressable memory; and
    providing a capture and pipeline search data device for capturing and providing the search data for searching the content addressable memory.

20. The method as recited in claim 19, wherein the operation of providing the search data and search control signals to the search control block further comprises:
    providing an output buffer for receiving the result of the search operations from the content addressable memory, wherein the output buffer provides the result for output.

21. The method as recited in claim 19, wherein the operation of performing the read/write operations further comprises:
    providing a clock bridge for generating signals for synchronizing the read/write operations with the search operations of the content addressable memory.

22. A three-port content addressable memory device, comprising:
    a content addressable memory for storing data;
    a first port configured to receive search data and search control signals for searching the search data in the content addressable memory, wherein search operations are performed by accessing the content addressable memory,
    a second port configured to output search results from the content addressable memory; wherein the content addressable memory outputs search results of the search operations via a second port; and
    a third port configured to communicate read/write data to and from the content addressable memory for read/write operations.

23. The three-port content addressable memory device as recited in claim 22, wherein the search operations are performed within search cycles, each search cycle comprising multiple clock cycles, and wherein more than one search operations are capable of being performed simultaneously over one or more clock cycles.

24. The three-port content addressable memory device as recited in claim 22, wherein one or more read or write operations are performed simultaneously with a search operation by accessing the content addressable memory.

25. The three-port content addressable memory device as recited in claim 22, wherein the content addressable memory includes a set of banks for storing the data and wherein the data is accessed from one of the banks in a read/write operation while the data in another bank is searched in a search operation.

26. The three-port content addressable memory device as recited in claim 22, wherein the first port, second port, and third port are search input port, search result port, and read/write port.

27. A content addressable memory device with separate search and read/write data paths, comprising:

a content addressable memory for storing data;

a first data path configured to transmit search data, search control signals and search clock signals for searching the search data in the content addressable memory, wherein search operations are performed by accessing the content addressable memory;

a second data path configured to output search results from the search operations of the content addressable memory; and a third data path configured to communicate read/write data, read/write control signals and read/write clock signals to and from the content addressable memory for read/write operations, the first data path being independent from the third data path.

28. The three-port content addressable memory device as recited in claim 27, wherein one or more read or write operations are performed simultaneously with a search operation by accessing the content addressable memory.

* * * * *